United States Patent
Unno et al.

(10) Patent No.: US 9,129,683 B2
(45) Date of Patent: Sep. 8, 2015

(54) HIGH PERFORMANCE SEMICONDUCTOR MEMORY DEVICE THAT HAS DIFFERENT PAGE ADDRESSES ALLOTTED TO MULTIPLE BITS OF MEMORY CELLS

(71) Applicant: KABUSHIKI KAISHA TOSHIBA, Tokyo (JP)

(72) Inventors: Masaki Unno, Kanagawa (JP); Naoya Tokiwa, Kanagawa (JP); Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 14/015,971

(22) Filed: Aug. 30, 2013

(65) Prior Publication Data

US 2014/0258614 A1    Sep. 11, 2014

(30) Foreign Application Priority Data

Mar. 8, 2013  (JP) .................. 2013-047029

(51) Int. Cl.
*G06F 3/06* (2006.01)
*G11C 16/10* (2006.01)
*G11C 11/56* (2006.01)
*G11C 16/30* (2006.01)

(52) U.S. Cl.
CPC ............ *G11C 16/10* (2013.01); *G11C 11/5628* (2013.01); *G11C 16/30* (2013.01)

(58) Field of Classification Search
USPC .................... 710/16–19; 386/185.02–24
See application file for complete search history.

(56) References Cited

U.S. PATENT DOCUMENTS

| | | | | |
|---|---|---|---|---|
| 7,257,032 B2 * | 8/2007 | Fujiu et al. | ............... | 365/185.24 |
| 7,349,249 B2 | 3/2008 | Honma et al. | | |
| 7,864,574 B2 * | 1/2011 | Cho et al. | ................. | 365/185.03 |
| 7,978,514 B2 * | 7/2011 | Shibata et al. | ........... | 365/185.03 |
| 8,107,287 B2 * | 1/2012 | Jung | ........................ | 365/185.03 |
| 8,462,548 B2 * | 6/2013 | Aritome | ................... | 365/185.02 |

FOREIGN PATENT DOCUMENTS

| | | |
|---|---|---|
| JP | 2005115982 A | 4/2005 |
| JP | 2009-129477 A | 6/2009 |

* cited by examiner

*Primary Examiner* — Tammara Peyton
(74) *Attorney, Agent, or Firm* — Patterson & Sheridan, LLP

(57) ABSTRACT

A semiconductor memory device includes a memory cell array having a plurality of memory cells, each memory cell configured to store plural bits of data, and a controller. The controller is configured to execute a write operation on the memory cells such that user data are written in at least one of the plural bits of data and prescribed data are written in the remaining bits of the plural bits of data. As a result, the number of bits of user data stored in the memory cells is less than the number of plural bits of data that each memory cell is configured to store.

17 Claims, 16 Drawing Sheets

FIG. 9

| PAGE NO. \ MODE | SLC | 4LC | ... | ... | ... | NLC | ... | ... | (X/2)LC | XLC |
|---|---|---|---|---|---|---|---|---|---|---|
| 0 | 0/1 | 0/1 | ... | ... | ... | 0/1 | ... | ... | 0/1 | 0/1 |
| 1 | 1 | 0/1 | ... | ... | ... | 0/1 | ... | ... | 0/1 | 0/1 |
| 2 | 1 | 1 | 0/1 | ... | ... | 0/1 | ... | ... | 0/1 | 0/1 |
| ... | ... | ... | ... | 0/1 | ... | ... | ... | ... | ... | ... |
| n-1 | 1 | 1 | 1 | 1 | 0/1 | 0/1 | ... | ... | 0/1 | 0/1 |
| n | 1 | 1 | 1 | 1 | 1 | 1 | 0/1 | ... | 0/1 | 0/1 |
| n+1 | 1 | 1 | ... | ... | ... | 1 | 1 | 0/1 | 0/1 | 0/1 |
| ... | 1 | 1 | 1 | ... | ... | 1 | ... | 1 | 0/1 | 0/1 |
| x-2 | 1 | 1 | 1 | ... | ... | 1 | ... | ... | 1 | 0/1 |
| x-1 | 1 | 1 | 1 | ... | ... | 1 | ... | ... | 1 | 0/1 |

FIG. 11

| PAGE NO. \ MODE | SLC | 4LC | ... | ... | ... | NLC | ... | ... | (X/2)LC | XLC |
|---|---|---|---|---|---|---|---|---|---|---|
| 0 | 0/1 | 0/1 | ... | ... | ... | 0/1 | ... | ... | 0/1 | 0/1 |
| 1 | ※1 | 0/1 | ... | ... | ... | 0/1 | ... | ... | 0/1 | 0/1 |
| 2 | ※1 | ※1 | ... | ... | ... | 0/1 | ... | ... | 0/1 | 0/1 |
| ... | ... | ... | ... | ... | ... | ... | ... | ... | ... | ... |
| n-1 | ※1 | ※1 | 0/1 | ※1 | 0/1 | 0/1 | ... | ... | 0/1 | 0/1 |
| n | ※1 | ※1 | ※1 | ... | ※1 | 0/1 | ... | ... | 0/1 | 0/1 |
| n+1 | ※1 | ※1 | ※1 | ... | ... | ※1 | 0/1 | 0/1 | 0/1 | 0/1 |
| ... | ... | ... | ... | ... | ... | ... | ... | ... | ... | ... |
| x-2 | ※1 | ※1 | ... | ... | ... | ※1 | ※1 | 0/1 | 0/1 | 0/1 |
| x-1 | ※1 | ※1 | ... | ... | ... | ※1 | ... | ... | ※1 | 0/1 |

※1 VALUE OF THE PRECEDING PAGE

FIG. 12

| PAGE NO. \ MODE | SLC | 4LC | ... | ... | ... | NLC | ... | ... | (X/2)LC | XLC |
|---|---|---|---|---|---|---|---|---|---|---|
| 0 | 0/1 | 0/1 | ... | ... | ... | 0/1 | ... | ... | 0/1 | 0/1 |
| 1 | ※2 | 0/1 | ... | ... | ... | 0/1 | ... | ... | 0/1 | 0/1 |
| 2 | ※2 | ※2 | ... | ... | ... | 0/1 | ... | ... | 0/1 | 0/1 |
| ... | ... | ... | ... | ... | ... | ... | ... | ... | ... | ... |
| n-1 | ※2 | ※2 | ※2 | 0/1 | ... | 0/1 | ... | ... | 0/1 | 0/1 |
| n | ※2 | ※2 | ※2 | ※2 | 0/1 | ※2 | ... | ... | 0/1 | 0/1 |
| n+1 | ※2 | ※2 | ※2 | ... | ... | ... | 0/1 | ... | 0/1 | 0/1 |
| ... | ... | ... | ... | ... | ... | ... | ... | ... | ... | ... |
| x-2 | ※2 | ※2 | ※2 | ... | ... | ※2 | ※2 | 0/1 | 0/1 | 0/1 |
| x-1 | ※2 | ※2 | ※2 | ... | ... | ※2 | ※2 | ※2 | ※2 | 0/1 |

※2 EITHER 0 OR 1

Case of writing x bits of data (1) = writing operation + verify operation

Case of writing y bits of data (y<x)

(1) = writing operation + verify operation ature of the cells. FIGS. 1 and 2 illustrate
HIGH PERFORMANCE SEMICONDUCTOR MEMORY DEVICE THAT HAS DIFFERENT PAGE ADDRESSES ALLOTTED TO MULTIPLE BITS OF MEMORY CELLS

CROSS-REFERENCE TO RELATED APPLICATION

This application is based upon and claims the benefit of priority from Japanese Patent Application No. 2013-047029, filed Mar. 8, 2013, the entire contents of which are incorporated herein by reference.

FIELD

Embodiments described herein relate generally to a semiconductor memory device.

BACKGROUND

A multi-value NAND-type flash memory includes memory cells, each of which holds data of two or more bits.

DESCRIPTION OF THE DRAWINGS

FIG. 9 is a diagram illustrating an example of data allotment according to the first embodiment.

FIG. 11 is a diagram illustrating an example of data allotment according to a second embodiment.

FIG. 12 is a diagram illustrating an example of data allotment according to a third embodiment.

DETAILED DESCRIPTION

A semiconductor memory device according to an embodiment comprises a memory cell array including a plurality of memory cells, each memory cell configured to store plural bits of data, and a controller. The controller is configured to execute a write operation on the memory cells such that user data are written in at least one of the plural bits of data and prescribed data are written in the remaining bits of the plural bits of data. The number of bits of user data stored in the memory cells is less than the number of plural bits of data that each memory cell is configured to store.

Figure 1:
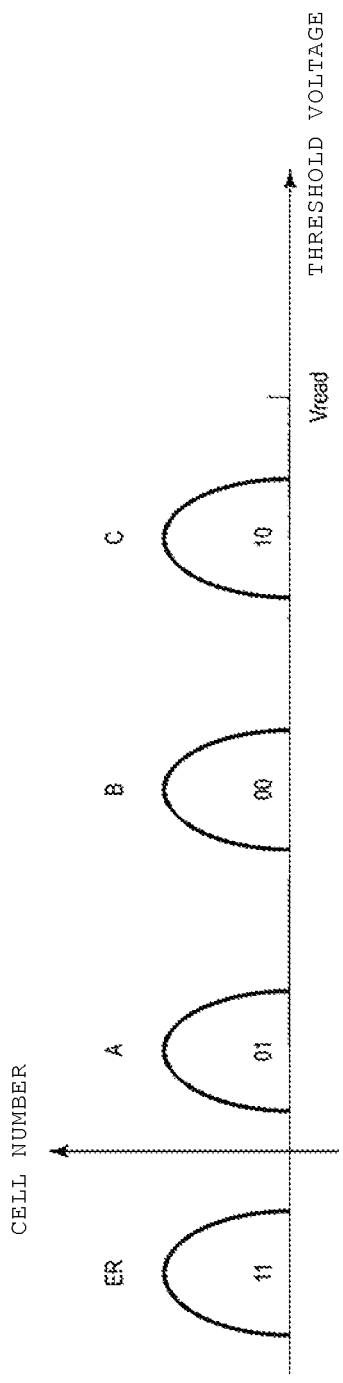
FIG. 1 is a diagram illustrating an example of distribution of a threshold voltage in a four-level cell (4 LC).
Figure 2:
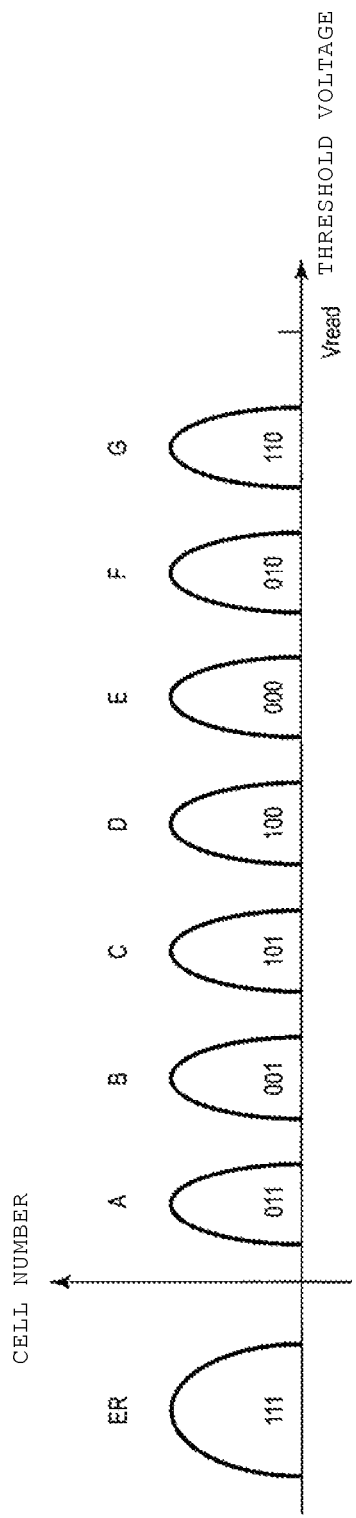
FIG. 2 is a diagram illustrating an example of distribution of a threshold voltage in an eight-level cell (8 LC).

In general, according to one embodiment, in a multi-value memory, different page addresses are allotted to the multiple bits of the various memory cells (cells). For example, for the data retention with 2 bits/cells, 2 pages (a lower page and an upper page) are allotted to one cell row; for the data retention with 3 bits/cells, 3 pages (a lower page, a middle page, and an upper page) are allotted to one cell row. Similarly, for the data retention with x bits/cells, x pages are allotted to one cell row. The cell has a threshold voltage corresponding to the combination of the data of multiple bits held by the cell. In practice, even for the multiple cells having the same threshold voltage, dispersion in the threshold voltage takes place due to dispersion in the characteristics of the cells. FIGS. 1 and 2 illustrate the ideal threshold distributions in a 4 LC and an 8 LC.

Figure 3:
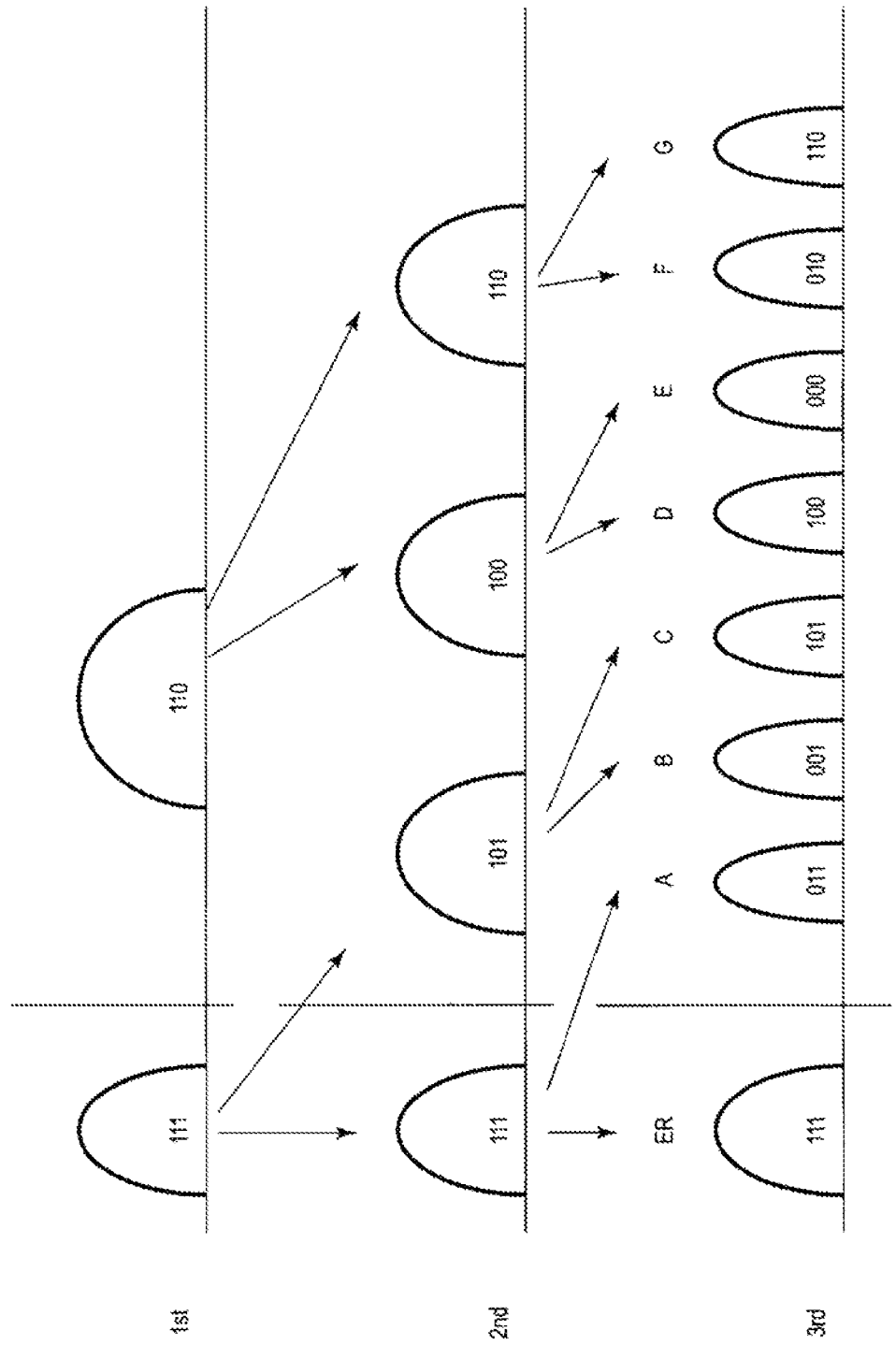
FIG. 3 is a diagram illustrating an example of a write operation carried out for each page in 8 LC.

In FIGS. 1 and 2, threshold distribution of an erasure state is called ER, and the subsequent distributions in increasing order are called A level, B level, and C level. As shown in FIG. 3, the write operation of the multi-value data in the cells is typically carried out sequentially from the bottom page to the top page. An example of the 8 LC is shown in FIG. 3. Here, the lower page, the middle page, and the upper page are written in the first, second and third stages, respectively. Such a write scheme is adopted because the Yupin effect can be suppressed for a memory device with significant variation in the threshold voltage of cells due to parasitic capacitance between the cells. For a memory device that supports such a write operation (known as the write operation for each page), by selecting when the write operation ends, it is possible to select the number of data bits for each cell. That is, for the writing of the lower page, the data retention of 1 cell/1 bit (SLC) is selected; for writing to the middle page, the data retention of 4 LC is selected; and, for the writing to the upper page, the data retention of 8 LC is selected. Consequently, for the write-in-each-page memory, there is no need to prepare dedicated write modes for the SLC, 4 LC, 8 LC, etc.

Figure 4:
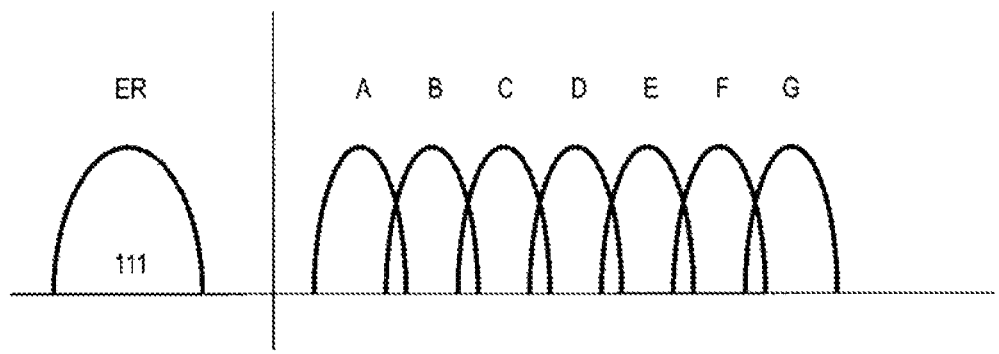
FIG. 4 is a diagram illustrating an example of the distribution of the threshold voltage realized by data retention in 8 LC.

On the other hand, there is also a memory device with a small Yupin effect. For such memory device, there is no need to write each page separately. Consequently, it is possible to execute the write operation to multiple pages with a single write operation. With such write operation (known as the page en bloc write operation), realizing a high speed for writing is possible. For the page en bloc write operation, there is no increase in the writing time when the bit number is increased. This is different from the case when more time is needed as the bit number for each cell is increased in the write-in-each-page mode. However, for the page en bloc write operation, when writing, the data for all of the pages are needed, and it is not possible to carry out writing for only a portion of the multiple pages. Consequently, for example, as shown in FIG. 4, when the distribution is partially overlapped in an 8 LC, data retention is not possible because of the overlap in threshold voltage distribution. Although it is possible in theory to have data retention with less quantity, such as 4 LC, using only the non-overlapped portion of distribution, there is yet no means for executing data retention with less quantity. For such a memory device, only data retention with SLC is possible (retention with SLC is needed only for the 2 states of 0 or 1 for all of the bits).

It is technically possible to increase the width between the distributions to avoid overlap. However, as a result of this scheme, a read voltage VREAD where a memory cell transistor is turned on independent of a threshold voltage thereof increases. However, an increase in the voltage VREAD is undesirable as this increase leads to an increase in the power consumption of the memory.

In the following, embodiments will be explained with reference to figures. In the following explanation, the same keys will be adopted to represent the structural elements with nearly the same function and configuration, and the repeated explanation thereof will be made as necessary. The figures are schematic diagrams, and one should know that the relative thicknesses and planar dimensions, as well as the ratio of thickness of the various layers, etc. are different from the actual dimensions. In addition, for the embodiments to be explained, the devices and methods for embodiment of the technical ideas of this embodiment will be presented as examples. The technical ideas of the embodiment, however, are not limited to the following described materials, shapes, structures, arrangements, etc. of the structural elements. Various variations can be applied to the technical ideas of the embodiment.

(First Embodiment)

Figure 5:
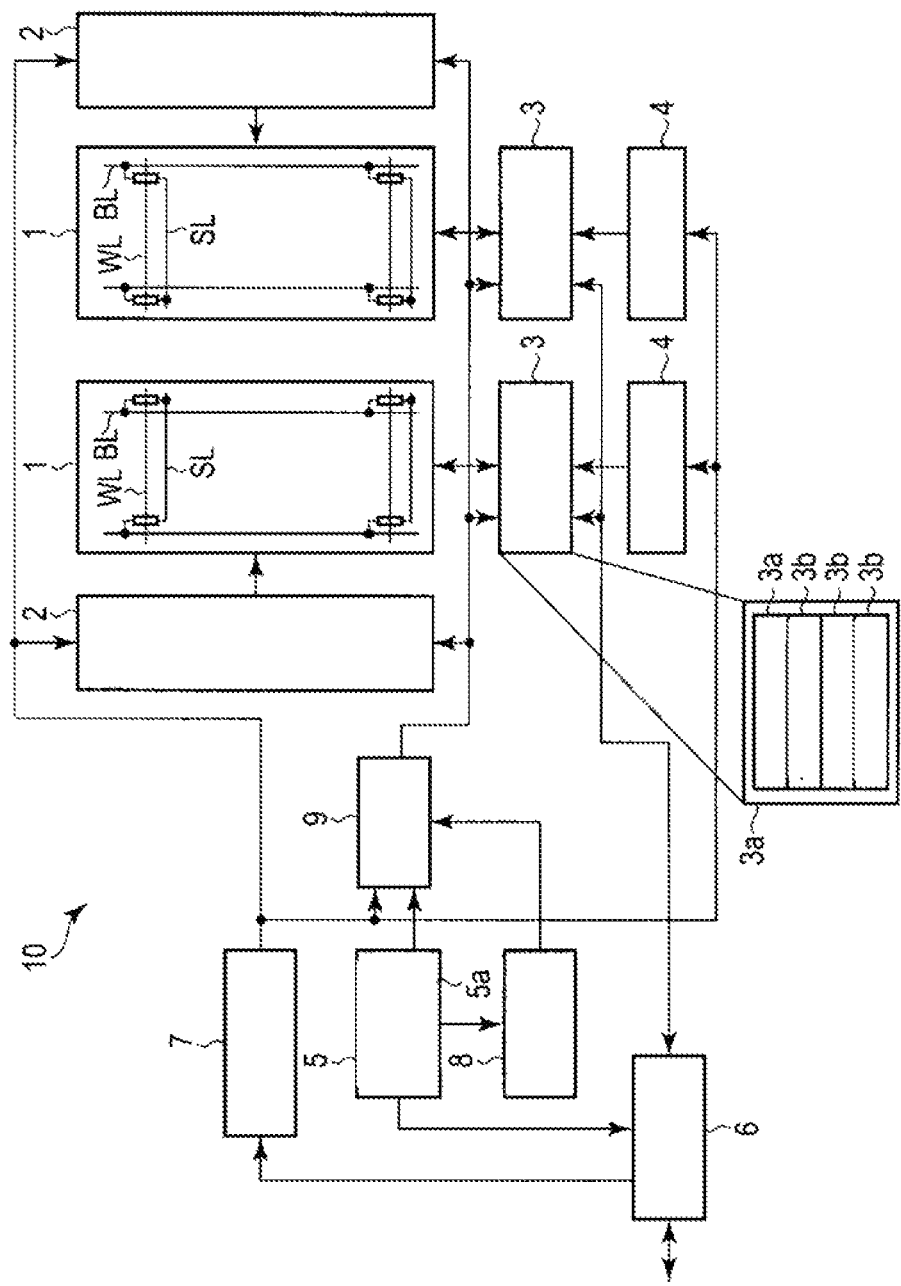
FIG. 5 is a block diagram illustrating a semiconductor memory device according to a first embodiment.

FIG. 5 is a block diagram illustrating a semiconductor memory device 10 according to a first embodiment. Various functional blocks can be realized by hardware, computer software, or a combination thereof. Consequently, in the following, the functions of the various blocks will be explained, and the blocks may be realized by hardware, software, or a combination thereof. In addition, some functions may be realized by functional blocks different from the functional blocks shown in the examples. In addition, the functional blocks shown in the examples can be further divided into finer functional sub-blocks.

As shown in FIG. 5, the semiconductor memory device 10 includes a memory cell array 1, a row decoder 2, a data circuit/page buffer 3, a column decoder 4, a controller 5, an input/output circuit 6, an address/command register 7, a voltage generator 8, and a core driver 9.

The semiconductor memory device 10 includes plural memory cell arrays 1 (two memory cell arrays are shown as an example). The memory cell array 1 may also be called a "plane." Each memory cell array 1 includes plural blocks (memory blocks). Each block comprises plural memory cells (memory cell transistors), word lines WL, bit lines BL, etc. The memory space of the plural memory cells forms one page or plural pages. The data are read in units of a page. The memory cells are formed to exhibit a very small Yupin effect, and the structure allows the data of x bits (where x is a natural number of 2 or more) as the maximum content that can be held by the memory cells to be written en bloc (the page en bloc write operation). The details of the memory cell array 1 will be explained later.

In each memory cell array 1, a group of the row decoder 2, the data circuit/page buffer 3 and the column decoder 4 is arranged. The row decoder 2 receives from the address/command register 7 a block address signal or the like. Also, the row decoder 2 receives from the core driver 9 a word line control signal and a select gate line control signal. The row decoder 2 selects the block, the word line, etc. on the basis of the received block address signal, the word line control signal, and the select gate line control signal.

The data circuit/page buffer 3 temporarily holds the data read from the memory cell array 1, receives the data written from out of the semiconductor memory device 10, and writes the data received in the selected memory cell. The data circuit/page buffer 3 includes a sense amplifier unit 3a. The sense amplifier unit 3a includes plural sense amplifiers that are connected to the plural bit lines BL and amplify the potentials on the plural bit lines BL. The semiconductor memory device 10 can hold data of 2 or more bits in each memory cell. The data circuit/page buffer 3 includes, for example, 3 data caches 3b. The first data cache 3b holds either the lower page data or the upper page data; the second data cache 3b holds the other of the lower page data and the upper page data. The lower page data include a group of the lower bits of the various 2-bit data of the plural memory cells which will be described later. The upper page data include a group of the upper bits of the various 2-bit data of the plural memory cells. The third data cache 3b holds a temporary data re-written in the memory cells, for example, during a verify read operation.

The column decoder 4 receives a column address signal from the address/command register 7 and decodes the received column address signal. The column decoder 4 controls the input/output of the data of the data circuit/page buffer 3 on the basis of the decoded address signal.

The controller 5 receives commands instructing read, write, erasure, etc. from the address/command register 7. On the basis of the instruction of the command, the controller 5 controls the voltage generator 8 and the core driver 9 according to a prescribed sequence. Also, the controller 5 has a nonvolatile memory device 5a. The voltage generator 8 generates the various voltages according to the instruction of the controller 5. The core driver 9 controls the row decoder 2 and the data circuit/page buffer 3 for controlling the word lines WL and the bit lines BL according to the instruction of the controller 5. The input/output circuit 6 controls the input of the commands, addresses, and data from out of the semiconductor memory device 10 and controls the output from the semiconductor memory device 10.

Figure 6:
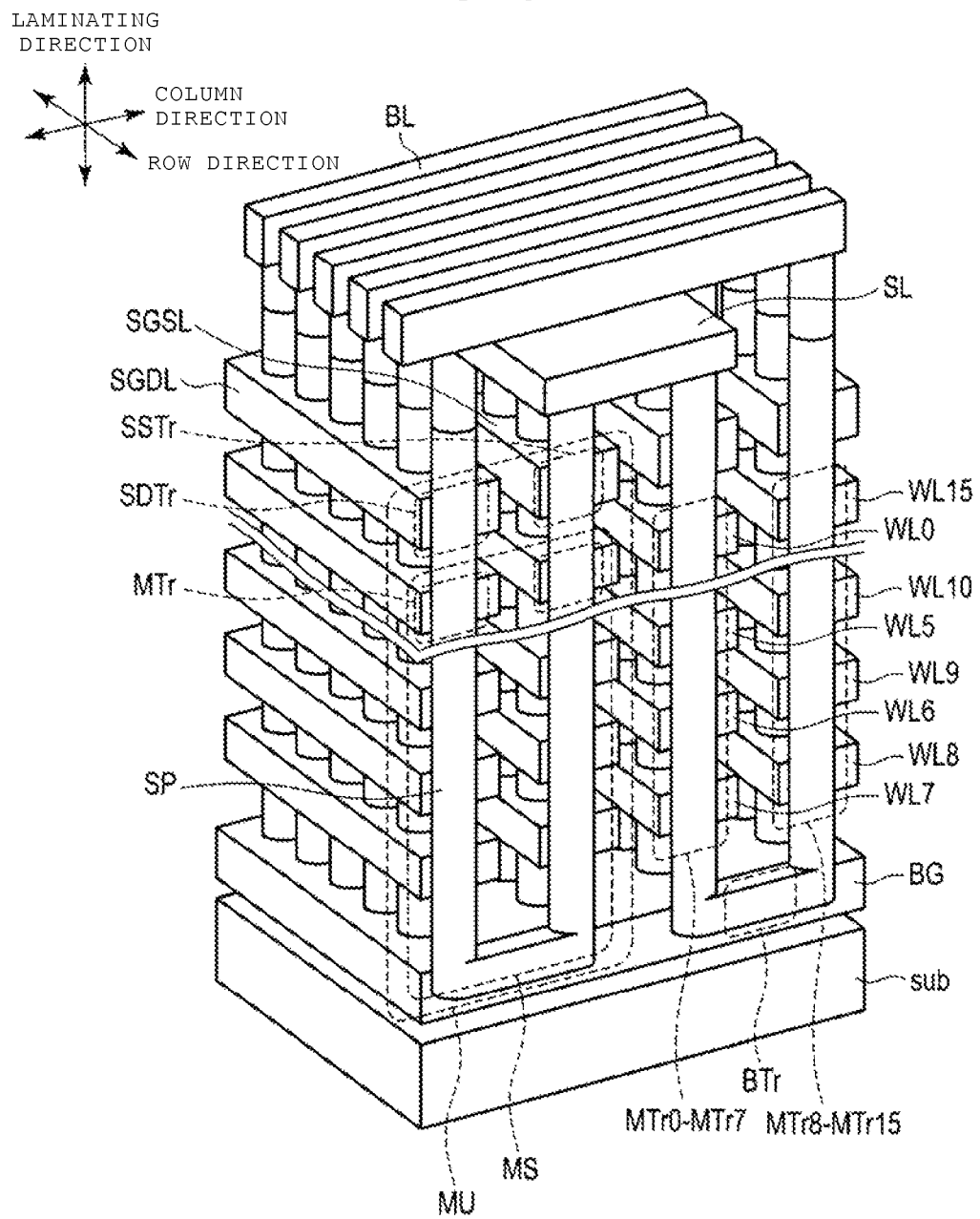
FIG. 6 is a perspective view illustrating a portion of a memory cell array according to the first embodiment.

The memory cell array 1 has the structure shown in FIG. 6. FIG. 6 is a perspective view illustrating a portion of the memory cell array according to the first embodiment. The figure shows one of the plural blocks in the memory cell array 1. FIG. 6 shows plural bit lines BL that extend in the column direction, one of plural source (cell source) lines SL that extend in the row direction which is orthogonal to the column direction, and a plurality of memory units MU arranged in a matrix configuration in the row direction and the column direction. As shown, plural memory units MU are connected to one bit line BL.

Each of the memory units MU includes a memory string MS, a source-side select gate transistor SSTr, and a drain-side select gate transistor SDTr. The memory string MS is located above a substrate sub along the laminating direction. The memory string MS includes z+1 (z is, for example, 15) memory cell transistors MTr0 through MTr15 connected in tandem and a back gate transistor BTr. When there is no need to distinguish the keys with the numerals at the tail (e.g., cell transistor MTr), the numerals at the tail are omitted in the description. Such a description refers to all of the keys collectively. The memory cell transistors MTr0 through MTr7 are arranged side by side in this order in the direction approaching the substrate sub along the laminating direction. The cell transistors MTr8 through MTr15 are arranged side by side in this order in the direction away from the substrate sub along the laminating direction. The cell transistor MTr includes a semiconductor pole SP, an insulating film on the surface of the semiconductor pole SP, and a word line WL (a control gate) as described in detail later. The back gate transistor BTr is connected between the bottom cell transistors MTr7 and MTr8.

The select gate transistors SSTr, SDTr are located above the top cell transistors MTr0, MTr15 along the laminating direction, respectively. The drain of the transistor SSTr is connected to the source of the cell transistor MTr0. The source of the transistor SDTr is connected to the drain of the cell transistor MTr15. The source of the transistor SSTr is connected to the source line SL. The drain of the transistor SDTr is connected to the bit line BL.

The gates of the memory transistors MTr0 of the plural memory units MU arranged side by side in the row direction in the block are commonly connected to the word line WL0. Similarly, the gates of the cell transistors MTr1 through MTr15 of the plural memory units MU arranged side by side along the row direction in the block are commonly connected to the word lines WL1 through WL15, respectively. The word lines WL extend in the row direction. The group of the cell transistors MTr that share the word lines among the cell transistors MTr in the string along the row direction in each block and that are connected to the bit lines BL0 through BLm, forms a physical sector. A memory space made of one physical sector forms one or more pages. The gates of the back gate transistors BTr are commonly connected to the back gate line BG. Each memory cell can hold up to x bits of data as described above. Consequently, up to x pages can be allotted to each physical sector. Also, one or plural pages may be formed from a portion of the memory space of the physical sector.

The gates of the transistors SDTr of the plural memory units MU arranged side by side in the row direction in the block are commonly connected to the drain-side select gate line SGDL. The drains of the transistors SDTr of the plural memory units MU arranged side by side in the column direction are connected to the same bit line BL. The drain-side select gate line SGDL extends in the row direction.

The gates of the transistors SSTr of the plural memory units MU arranged side by side in the row direction in the block are commonly connected to the source-side select gate line SGSL. The sources of the transistors SSTr of the two memory units MU arranged side by side in the column direction are connected to the same source lines SL. The sources of the transistors SSTr of the plural memory units MU arranged side by side in the row direction in the block are connected to the same source line SL. The select gate line SGSL and the source line SL extend in the row direction.

Figure 7:
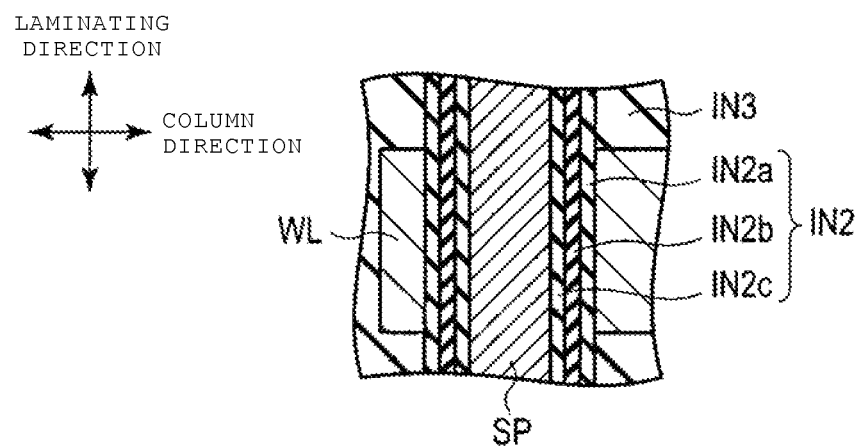
FIG. 7 is a cross-sectional view illustrating a memory cell transistor according to the first embodiment.

The cell transistor MTr has the structure shown in FIG. 7. FIG. 7 is a cross-sectional view illustrating the cell transistor according to the first embodiment. The word line (gate) WL may be made of polysilicon or polycide. Holes are formed through the plural word lines WL and the insulating film between them. On the surface of the hole, an insulating film IN2 is formed, and the semiconductor pole SP is formed in the hole. The semiconductor pole SP extends in the laminating direction. The semiconductor poles are arranged side by side in a matrix configuration along the plane including in the row direction and the column direction, and they may be made of a semiconductor (such as silicon) doped with impurities.

The insulating film IN2 includes a tunnel insulating film IN2a, a charge storage film IN2b, and an inter-electrode insulating film IN2c. The tunnel insulating film IN2a may be made of silicon oxide ($SiO_2$). The charge storage layer IN2b is formed on the tunnel insulating film IN2a. The charge storage layer IN2b accumulates the charge and may be made of silicon nitride (SiN). The inter-electrode insulating film IN2c is formed on the charge storage layer IN2b. The inter-electrode insulating film IN2c may be made of silicon oxide. The cell current flowing in the semiconductor pole SP varies corresponding to the potential of the word line WL and the number of carriers in the charge storage layer IN2b, and this variation is exploited to store the data in the cell transistor MTr in a nonvolatile way.

Figure 8:
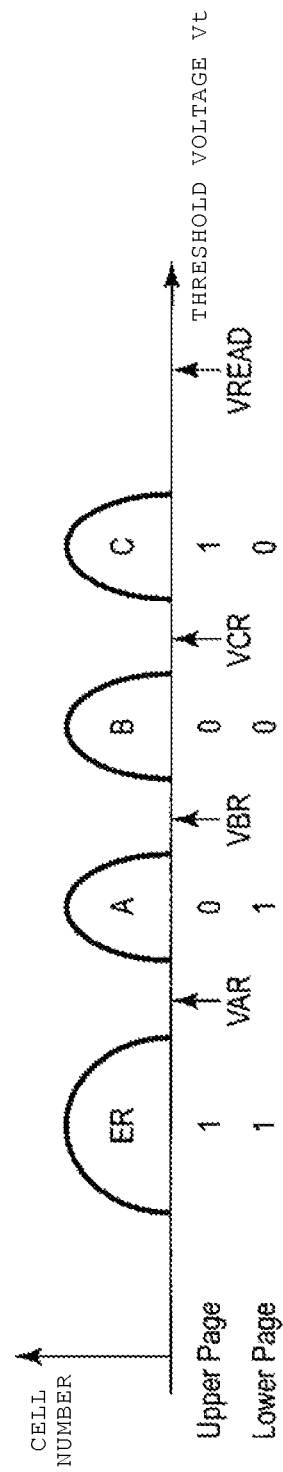
FIG. 8 is a diagram illustrating a relationship between the state of the cell transistor and the corresponding data according to the first embodiment.

The memory cell can hold up to x bits of data. Consequently, any of the 2x(=X) threshold voltages is applied to the memory cell. One threshold voltage corresponds to one among plural combinations on the basis of the data having plural bits. FIG. 8 shows an example of the relationship between the state of the cell transistor and the corresponding data according to the first embodiment. Specifically, FIG. 8 is a diagram illustrating an example in which a 2-bit data is held in one cell transistor MTr. Because data retention can be carried out with 2 bits/cells (4 LC), the cell transistor MTr can have four threshold voltages. The cell transistor MTr is controlled to have a desired threshold voltage Vt by means of controlling the quantity of the carriers in the charge storage layer IN2b. In practice, dispersion takes place in the threshold voltage Vt so that there is a distribution, as that shown in FIG. 8, even for the plural cell transistors MTr applied with the same threshold voltage Vt caused by the dispersion in the characteristics among the cell transistors MTr. The lowest voltage distribution ER is obtained by erasing the cell transistor MTr. The distributions A through C can be obtained by the write operation for the cell transistor MTr.

Because of the data retention of 2 bits/cells, the 2 bits correspond to the two page addresses, respectively. That is, the data of the lower page and the data of the upper page are held by one memory cell. As shown in FIG. 8, for example, the data "1" of the lower page corresponds to the distribution E and the distribution A, and the data "0" of the lower page corresponds to the distribution B and the distribution C. The data "1" of the upper page corresponds to the distribution E and the distribution C, and the data "0" of the upper page corresponds to the distribution A and the distribution B.

With such corresponding relationships, for the bits of the lower page, by reading with the application of a voltage VBR on the word line WL, it is possible to determine which of the data of "1" and "0" is held. That is, as the voltage VBR is received on the word line WL, the cell transistor MTr having the threshold voltage contained in the distribution E or the distribution A is turned on. As a result, the cell current flows from the bit line BL to the source line SL via the cell transistor MTr. On the other hand, the cell transistor MTr having the threshold voltage contained in the distribution B or the distribution C is not turned on even when the voltage VBR is received in the word line WL, and no cell current flows. Such a difference in the cell current is detected by the sense amplifier unit 3a, and a determination is made regarding whether the cell transistor MTr as the read subject holds the data "0" or the data "1" in the lower bit.

For the bits in the upper page, by applying voltages VAR and VCR to the word line WL, the prescribed arithmetic and logic operation is carried out in the data circuit/page buffer 3 with respect to the cell current flowing in the word line, and the data is identified. That is, a determination is made that the data "0" in the upper bit is held in the cell transistor MTr having the threshold voltage between the voltages VAR and VCR and that the data "1" in the upper bit is held in the cell transistor MTr having a threshold voltage lower than the voltage VAR or higher than the voltage VCR. The voltage VREAD is a voltage at which the cell transistor MTr is turned on independent of the held data.

This is an example of the general 4 LC. For the memory system for 3 or more bits, the operation of dividing of the threshold voltage distribution to 8 or more types corresponding to the even upper page data is added to the operation, so that the basic operation is the same.

FIG. 9 is a diagram illustrating an example of data allotment according to the first embodiment. In the first embodiment, the data allotment as that shown in FIG. 9 is adopted, and the data retention with NLC (the NLC mode) is realized in the pseudo mode. N is the number of threshold voltages adopted for each cell, where $N=2^{n+1}$. Here, n is the page number and is 0 or a natural number of x−1 or smaller. Each column corresponds to one mode, and the case with N=0 corresponds to the SLC mode. Each row corresponds to one page, and the pages are arranged side by side in the rising order from the bottom page (the $0^{th}$ page) to the top page (the $(x-1)^{th}$ page) as the row from the top the bottom. As shown in FIG. 9, in the pseudo NLC mode, just as in the NLC mode, 1 or 0 is held corresponding to the held data for the $0^{th}$ through $n^{th}$ pages. That is, in all of the cell transistors MTr in one physical sector, 1 or 0 is held corresponding to the data held in the n+1 bits ($0^{th}$ through $n^{th}$ bits) counted from the bottom. On the other hand, in the pseudo NLC mode, the data of the $(n+1)^{th}$ page through $(x-1)^{th}$ page are fixed at 1. That is, all of the cell transistors MTr in one physical sector hold 1 in the remaining (x−i) bits (the $(n+1)^{th}$ bit through the $(x-1)^{th}$ bit) (where i is a natural number less than x). As an example, in the pseudo 4 LC mode, in a certain physical sector, 1 or 0 is held in the $0^{th}$ and $1^{st}$ pages, and 1 is held in the $2^{nd}$ through $(x-1)^{th}$ pages. The controller 5 has a configuration to ensure that the fixed data are allotted and written in the pages where such data are not held (the data are not defined). That is, the controller 5 has a configuration wherein a bit row is prepared for allotment of a fixed value to the pages where no data are held, and the threshold voltage corresponding to the prepared bit row is applied to all of the cell transistors in one physical sector by means of the page en bloc write operation.

The controller 5 has a configuration that ensures the page en bloc write operation. In the page en bloc write operation, the physical sector as the write subject does not go through the state in which data are written in only certain pages among all of the pages. This is different from the mode of writing each page (see FIG. 3). The controller 5 reads the data only from the pages with the actual write operation performed for them (with the defined data held there).

The controller 5 holds in a nonvolatile state a parameter pertaining to the determination of whether the operation should be carried out in the pseudo NLC mode with certain value for, for example, each block, for a portion of the blocks, for a portion of the pages, or for the entire semiconductor memory device 10 (all of the blocks). This parameter corresponds to the bit number i adopted among all of the x bits supported by the semiconductor memory device 10. This parameter is held in a nonvolatile state in, for example, the cell transistors (the page) in the controller 5, and is set when the controller 5 is shipped. Then, as power is turned on for the semiconductor memory device 10, the controller 5 reads the parameter and holds the parameter in the memory device 5a (such as a register) (power-on read).

The pages with consecutive numbers counted from the bottom are employed for data retention. However, one may also adopt a scheme in which the pages in any consecutive or non-consecutive numbers are adopted in data retention. More specifically, in the pseudo NLC mode ($N=2^{n+1}$), among all of the $0^{th}$ through $(x-1)^{th}$ pages, any (n+1) pages may be used. That is, in the pseudo NLC mode, all of the cell transistors MTr in one physical sector hold 1 or 0 corresponding to the held data in any n+1 (=i) bits among the $0^{th}$ bit through the $(x-1)^{th}$ bit. All of the cell transistors in this physical sector hold 1 at the remaining (x−i) bits. As an example, in the pseudo 4 LC mode, 1 or 0 is held in the $0^{th}$ and $2^{nd}$ pages of a certain physical sector, and 1 is held in the $2^{nd}$ and the $3^{rd}$ through $(x-1)^{th}$ pages. As another specific example, the semiconductor memory device 10 has a configuration to ensure holding the data in the 8 LC; when the data are held in the pseudo 4 LC mode, the lower page and the upper page are used in data retention, while the middle page is used in holding 1.

Figure 10:
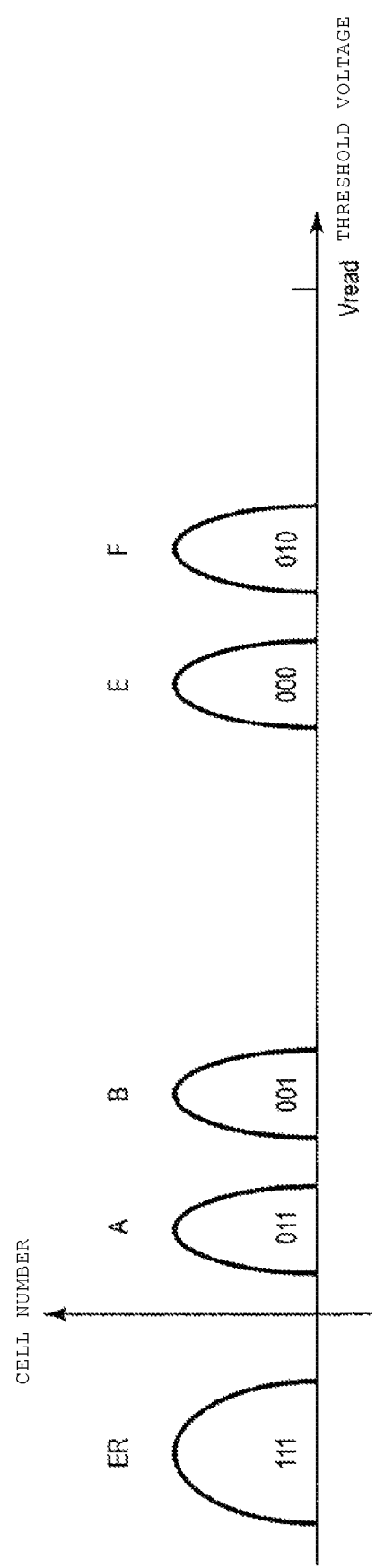
FIG. 10 is a diagram illustrating another example of data fixing according to the first embodiment.

In addition, the data of the pages that are not holding data are fixed at 1. However, the pseudo NLC mode can also be realized when they are fixed at data 0 instead of data 1. FIG. 10 shows the case of the data 0 fixing. In FIG. 10, another example of fixing the data according to the first embodiment is illustrated. In the example shown in FIG. 10, in the 8 LC mode, the 4 LC mode is realized in the pseudo mode. Also shown in FIG. 10, as the upper page is fixed at the data 0, although 4 levels are needed in the 4 LC mode, 5 levels, that is, the ER, A, B, E and F levels, are in use. However, in the read operation, the controller 5 recognizes that the data are written in the pseudo NLC mode, so that the upper page is not read. Hence, the controller 5 reads only the middle page and the lower page. As a result, it is possible to realize the 4 LC appropriately in a pseudo mode with only the 4 levels of A, B, E and F, while the ER level is excluded.

In the first embodiment, the write operation is carried out so that the same fixed data is held in all of the pages where no data are held. Consequently, even for a semiconductor memory device that does not support writing each page and uses the page en bloc write mode to x pages, it is still possible to realize the pseudo multi-value mode using less than x pages. Consequently, using the prescribed pages (or blocks) in the multi-value mode different from others is possible. For example, when the data retention bit number for one cell in each block is determined, using the multi-value mode different from the original multi-value mode only in a certain physical sector in a certain block is possible. As a result, even for the semiconductor memory device that does not support the mode of writing each page, it is still possible to save the physical sector, which cannot be used due to the trouble (such as overlap) in the threshold distribution in a certain multi-value mode, by using another multi-value mode.

In addition, as the semiconductor memory device 10 can realize the pseudo multi-value mode, the memory controller that controls the semiconductor memory device 10 can select the multi-value mode (such as any of the 4 LC, 8 LC, 16 LC, etc.). For example, when there is certain margin in the quantity of data written in the semiconductor memory device 10, the memory controller can write in the 4 LC mode, and, as the remaining memory capacity becomes smaller, the memory controller writes in the 8 LC mode. While a high memory capacity is left, by writing in the mode with less bits for each cell, it is possible to carry out a high-speed write and read operation.

(Second Embodiment)

In a second embodiment, data allotted to pages where no data are held are different from those in the first embodiment. FIG. 11 is a diagram illustrating an example of data allotment according to the second embodiment. As shown in FIG. 11, in the pseudo NLC mode, the data of the $(n+1)^{th}$ page through the $(x-1)^{th}$ page are identical to the data of the $n^{th}$ page through the $(x-2)^{th}$ page, respectively. Consequently, the same data as those for the $n^{th}$ page data are held in the $(n^{i1})^{th}$ page through the $(x-1)^{th}$ page. That is, for all of the cell transistors MTr in one physical section, in the pseudo NLC mode, in the $(n+1)^{th}$ bit through the $(x-1)^{th}$ bit counted from the top, the same value as that of the $n^{th}$ bit is held. On the other hand, in the $0^{th}$ page through the $n^{th}$ page, 1 or 0 corresponding to the held data is held. The controller 5 has a configuration to ensure that the prescribed data are allotted and written in the pages where such data are not held. Otherwise, the features in the second embodiment are the same as those in the first embodiment.

According to the second embodiment, the write operation is carried out so that the page not holding data is made to hold the same data as that in the page that is 1 step lower in the sequence. As a result, the same advantage as that of the first embodiment can be realized.

(Third Embodiment)

A third embodiment differs from the first embodiment in data allotted to the page not holding data. FIG. 12 is a diagram illustrating an example of data allotment according to the third embodiment. As shown in FIG. 12, in the pseudo NLC mode, the data in the $(n+1)^{th}$ page through the $(x-1)^{th}$ page may be either 0 or 1. A host or memory controller (not shown) holds control data that indicate whether the data allotted to the pages not holding data are all fixed to 0 or 1. This embodiment is different from the first embodiment in that the control value indicates the value allotted to the various bits of the pages not holding data. The controller 5 has a configuration to ensure that the write operation is carried out with the prescribed data allotted to the page not holding data. Otherwise, the third embodiment is identical to the first and second embodiments.

According to the third embodiment, the write operation is carried out so that either the data 0 or the data 1 is held in the page not holding data. As a result, the same advantage as that of the first embodiment can be realized.

(Fourth Embodiment)

Figure 13:
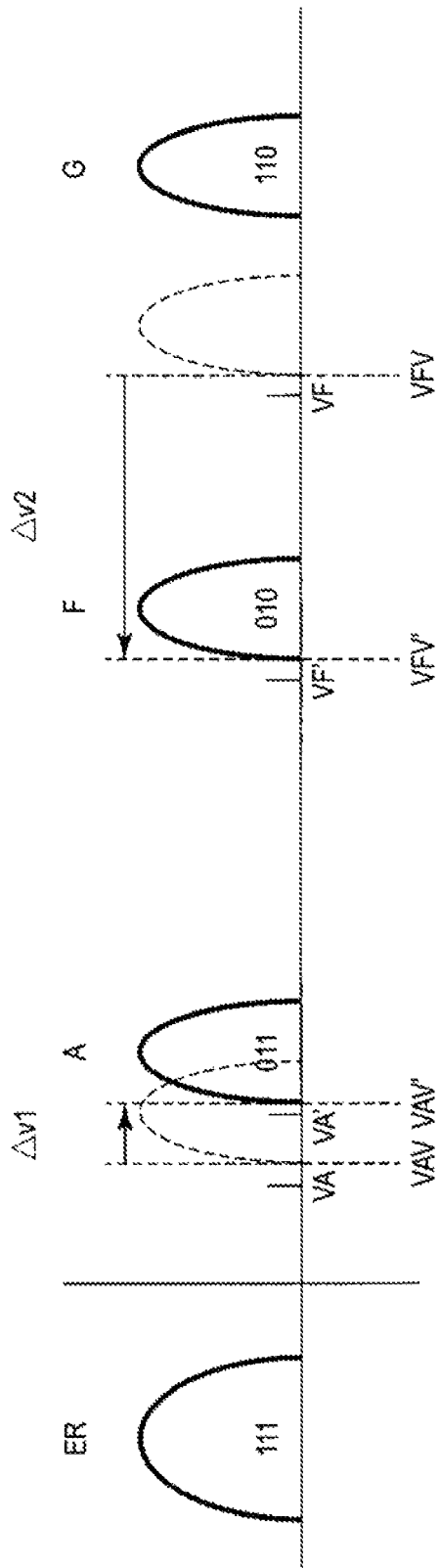
FIG. 13 is a diagram illustrating a shift of threshold voltage distribution according to a fourth embodiment.

In a fourth embodiment, some features are added to the first through third embodiments. According to the first through third embodiments, the number of the distributions of the N threshold voltages prepared for the NLC mode is less than N. As a result, a certain margin occurs in some spacings in the combination of the threshold voltage distributions. Here, as shown in FIG. 13, the positions of the threshold voltage distributions are offset from the original positions, that is, the positions adopted by the maximum number of the threshold voltage distributions. FIG. 13 is a diagram illustrating a shift in the threshold voltage distributions according to the fourth embodiment. More specifically, there are the following features. FIG. 13 shows the case when 4 threshold voltage distributions are adopted according to the pseudo NLC mode for the semiconductor memory device that adopts the page en bloc write mode using, for example, up to 8 threshold voltage distributions. As an example, FIG. 13 relates to an example in which the data of 111, the data of 011, the data of 010, and the data of 110 are adopted for the ER, A, F and G levels, respectively. That is, FIG. 13 relates to an example in which the middle page is fixed at 1.

In this example, the spacing between the A-level distribution and the F-level distribution (the minimum F level), that is, the spacing between the maximum A level and the minimum F level, is large. On the other hand, the spacing between the F-level distribution and the G-level distribution is small. Here, the A-level distribution is shifted by $\Delta v1$ in the positive direction, and/or the F-level distribution is shifted by $\Delta v2$ in the negative direction. This shift is carried out by shifting the verify read level as a section of the write operation. That is, a verify voltage VAV for the A-level write operation when the pseudo NLC mode is not in use as the default is shifted to a voltage VAV'. The voltage VAV' is higher than the voltage VAV by $\Delta v1$. Similarly, a verify voltage VFV for the F-level write operation as the default is shifted to a voltage VFV'. The voltage VFV' is lower than the voltage VFV by $\Delta v2$.

The read voltage for reading is also shifted in the same way. That is, a read voltage VA for the A-level determination as the default is shifted to a voltage VA'. The voltage VA' is higher than the voltage VA by $\Delta v1$. Similarly, a read voltage VF for the F-level determination as the default is shifted to a voltage VF'. Here, the voltage VF' is lower than the voltage VF by $\Delta v2$.

By means of the voltage shift, the 4 distributions become more even than the distributions at the original positions, respectively.

The controller 5 has a configuration to ensure that the voltage shift determined on the basis of the details in the pseudo NLC mode can be carried out. In addition, the controller 5 may also have a configuration to ensure that, when the write operation is carried out by continuously applying plural write voltages that increase stepwise, the first round of voltage application is adjusted so that the threshold of the cell transistor does not increase above the shifted target level.

Figure 14:
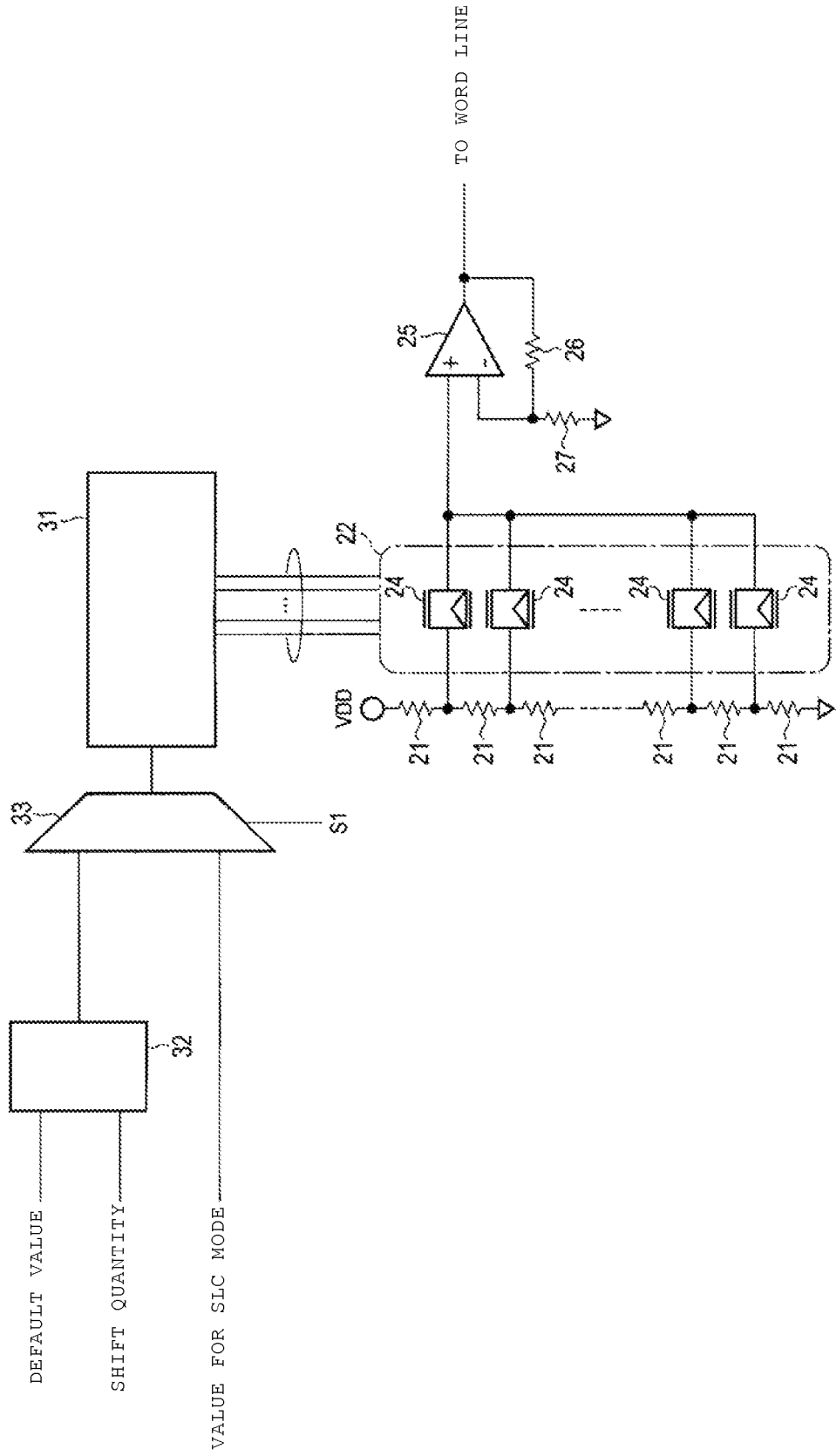
FIG. 14 is a diagram illustrating a portion of a voltage generating circuit according to the fourth embodiment.

For example, the voltage shift may be carried out with a circuit shown in FIG. 14. FIG. 14 shows a portion of the voltage generator 8 according to the fourth embodiment. In FIG. 14, in particular, a portion that generates the voltage applied on the word line WL is shown. As shown in FIG. 14, plural resistance elements 21 are connected in series between a power supply potential VDD and a ground potential VSS. Here, the power supply potential VDD is divided into various levels by a DAC (digital/analog converter) 22, and the value selected from them is output from the DAC 22. The DAC 22 has plural transfer gates 24. Each of the transfer gates 24 is connected between one of plural connecting nodes of the resistance elements 21 and an output of the DAC 22. The various transfer gates 24 include parallel connected n-type MOSFETs (metal oxide semiconductor field effect transistors) and the p-type MOSFETs. The output of the DAC 22 is fed to the non-inverted input of an op-amp 25. The op-amp 25 outputs a voltage to be applied on the word line WL. This voltage is fed via a resistance element 26 to the inverted input and is grounded via a resistance element 27. By making an appropriate selection of the transfer gate, which is turned on, from the plural transfer gates 24, the selected value is output from the DAC 22. Consequently, each of the transfer gates 24 receives one of the plural outputs of an M-to-$2^M$ decoder 31. The decoder 31 outputs a signal for turning on the transfer gate 24 selected on the basis of the input.

A default value of the applied voltage is applied on an M-bit full adder 32. The default value refers to the original value in each operation. For example, the default value is held in the cell transistors and, with the power-on read operation, is held in the memory device 5a of the controller 5. For example, when the voltage generator 8 generates a verify voltage for the A level shown in FIG. 13, the default voltage is VAV. The default value is represented by M bits.

The adder 32 also receives the positive or negative shift quantity (e.g., $\Delta v1$) applied on the voltage as the shift subject (e.g., voltage VAV) in the pseudo NLC mode. The shift quantity is adjustable. For example, the various types of shift quantities needed are predetermined, and such shift quantities are held in, for example, the cell transistors. They are then held in the memory device 5a with the power-on read operation. When the default voltage is adopted, the shift quantity is zero. The shift quantity is also represented by M bits. The adder 32 then sends the sum of the default value and the shift quantity to a multiplexer 33.

The multiplexer 33 also receives a value of the SLC mode. The value for the SLC mode is the value of the voltage adopted in the SLC mode and is represented by M bits. For the semiconductor memory device (including the semiconductor memory device 10 in the embodiment) that uses the page en bloc write mode, it is possible to execute the SLC mode even without any special configuration. In the SLC mode, the operation is realized by selecting the state in which 0 is held in all of the pages in one physical sector or the state in which 1 is held there. However, one may also prepare a mode used solely for SLC. The multiplexer 33 receives a signal S1 from the controller 5. The signal S1 selects the output of the adder 32 or the value for the SLC mode.

The output of the multiplexer 33, that is, the M-bit voltage value, is sent to the decoder 31. The decoder 31 outputs a signal to turn on the transfer gate 24 appropriately so that the prescribed voltage corresponding to the M-bit value is output from the DAC 22.

Figure 15:
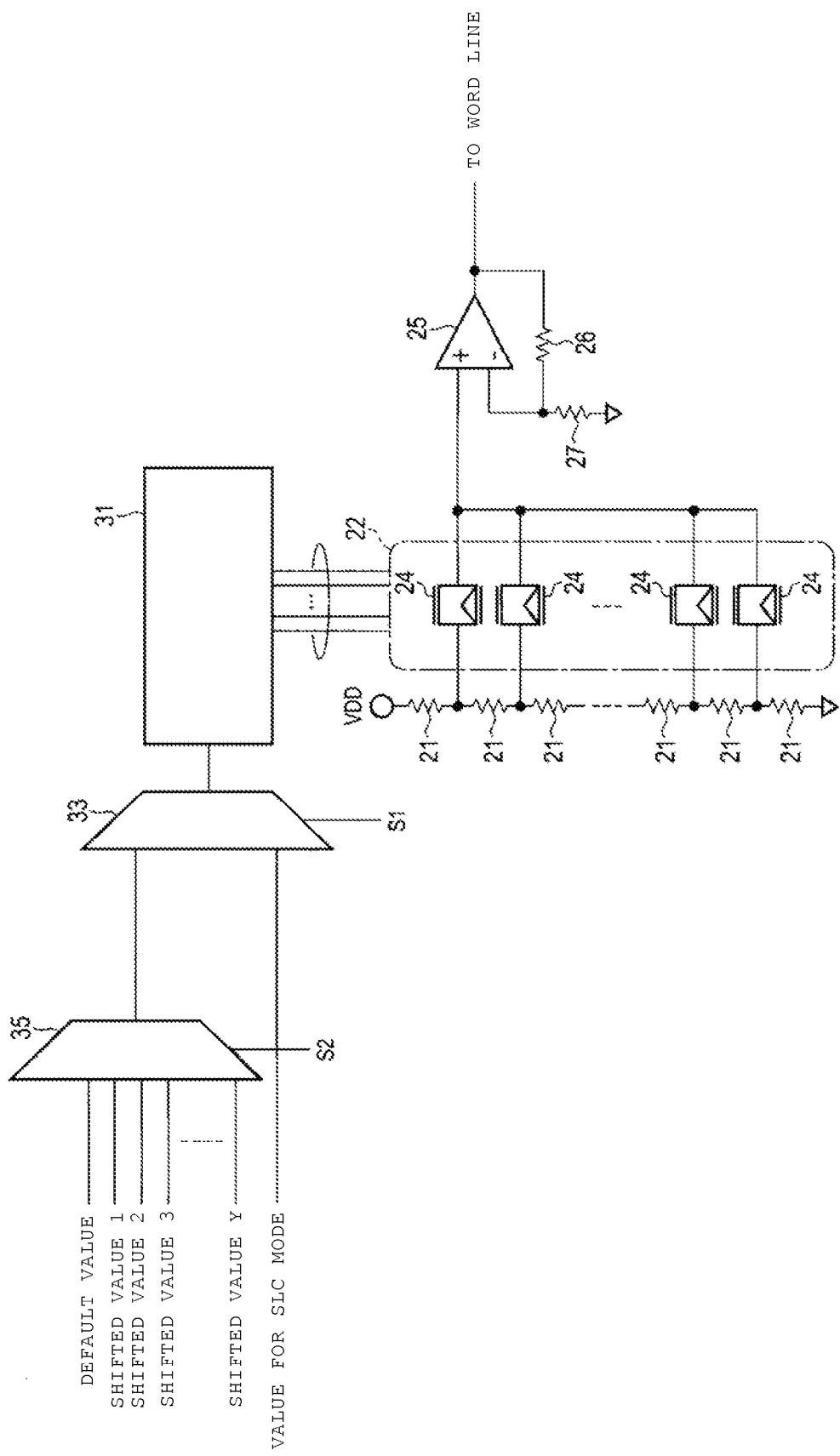
FIG. 15 is a diagram illustrating another example of a portion of the voltage generating circuit according to the fourth embodiment.

The output for the output of the voltage shifted by only the selected quantity may be carried out by using the circuit shown in FIG. 15. FIG. 15 is a diagram illustrating another example of a portion of the voltage generator 8 according to the fourth embodiment. In particular, FIG. 15 shows an example of the portion that generates the voltage applied to the word line WL. The circuit shown in FIG. 14 outputs the voltage shifted by only the selected quantity by adding the value to the default value. On the other hand, the circuit shown in FIG. 15 outputs the target voltage by selecting from the default value and the various voltage values that have been shifted.

As shown in FIG. 15, in place of the adder 32 shown in FIG. 14, the multiplexer 33 receives the output of a multiplexer 35. Here, the multiplexer 35 receives the default voltage value and the plural voltage values shifted differently. The shifted values are prepared beforehand according to the values adopted in the voltage generator 8. For example, they are held in the cell transistors and are then held in the memory device 5a with the power-on read operation. The multiplexer 35 receives a signal S2 from the controller 5. The signal S2 is an input selected from the plural inputs of the multiplexer 35. The remaining features and connections of the circuit shown in FIG. 15 are the same as those shown in FIG. 14.

According to the fourth embodiment, the same advantages as those in the first through third embodiments can be realized. Also, according to the fourth embodiment, the large spacing between the threshold voltage distributions is exploited in shifting the threshold voltage. As a result, the threshold voltage distributions are distributed more evenly, and the margin between the distributions increases. This increases the operation margin for the semiconductor memory device 10.

(Fifth Embodiment)

Figure 16:
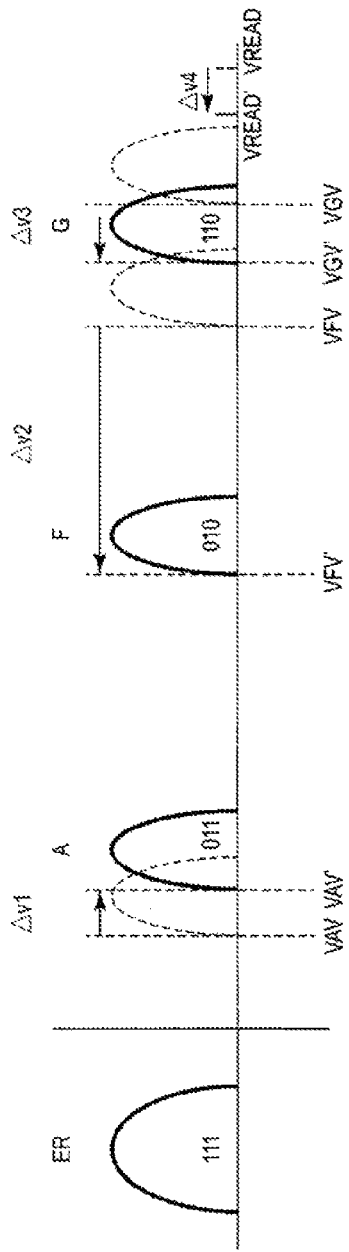
FIG. 16 is a diagram illustrating a shift of threshold voltage distribution according to a fifth embodiment.

A fifth embodiment adds some features to the fourth embodiment. Just as in the fourth embodiment, the fifth embodiment generates a margin for the spacing in some combination of the threshold voltage distributions according to the first through third embodiments. Here, as shown in FIG. 16, in addition to the shift of the threshold voltage distribution according to the fourth embodiment, the read voltage VREAD is also shifted from the original position. FIG. 16 is a diagram illustrating a shift in the threshold voltage distribution according to the fifth embodiment.

Just as FIG. 13, FIG. 16 also shows the case when 4 threshold distributions are in use in the pseudo NLC mode in a semiconductor memory device using the page en bloc write mode by means of, for example, up to 8 threshold voltage distributions. Here, as an example similar to that in FIG. 13, the verify voltage VAV for the A level as the default is shifted to the verify voltage VAV', and the verify voltage VFV for the F level as the default is shifted to the verify voltage VFV'. In addition, the verify voltage VGV for the G level as the default is shifted to the verify voltage VGV'. The verify voltage VGV' is lower than the verify voltage VGV by $\Delta v3$. In addition, the read voltage VREAD is also shifted to the read voltage VREAD'. The voltage VREAD' is lower than the read voltage VREAD by $\Delta v4$. The read voltage VREAD is a voltage at which the memory cell transistor is turned on independent of the threshold voltage.

The shift of the voltage VGV and the voltage VREAD is carried out by the circuit shown in FIGS. 14 and 15 in the fourth embodiment.

According to the fifth embodiment, just as in the fourth embodiment, it is possible to realize the same advantage as in the fourth embodiment. In addition, according to the fifth embodiment, by exploiting the increased spacing between the threshold voltage distributions, the read voltage VREAD can be decreased. The read voltage VREAD is substantially higher than any of the other read voltages corresponding to the various threshold voltages. Consequently, a decrease in the read voltage VREAD leads to a more significant decrease in the power consumption of the semiconductor memory device 10.

In addition, the embodiment is not limited to this configuration. As long as the main points are observed in the stage of embodiment, various modifications can be adopted. Furthermore, the embodiments each include various stages of operation. It is possible to extract various types of embodiments by appropriate combinations of the disclosed stages of the operation and plural composing requirements. For example, even when some composing requirements are deleted from the total composing requirements shown in the embodiments, the configuration after such deletions of some composing requirements still can be extracted as an embodiment.

The following modes may be adopted for the embodiment.

[1] A semiconductor memory device, wherein
by applying a certain threshold voltage among plural threshold voltages to be held by each of the plural memory cells, the data having plural bits are held in each of the plural memory cells;

without going through the state in which the data are held only in a certain held data bit row, the threshold voltage corresponding to the held data bit row is applied to be held by the plural memory cells;

a data bit row is prepared, that a prescribed value is allotted to the bits having no held data, and data are allotted to all of the plural bits; and the threshold voltage corresponding to the prepared data bit row is applied to be held by the plural memory cells.

[2] The semiconductor memory device according to [1], wherein
the data of up to x (x is a natural number of 2 or more) bits are held in the plural memory cells;

the data to be held are held in the i bits (i is a natural number smaller than x) among the x bits, and the prescribed value is allotted to the remaining (x−i) bits among the x bits; and wherein as the threshold voltage corresponding to the prepared data bit row is applied to be held by the plural memory cells, among the $2^x$ threshold voltages, $2^i$ threshold voltages corresponding to the prepared data bit row are applied to be held by the memory cells.

[3] The semiconductor memory device according to [2], wherein the i bits refer to the continuous i bits from the lowest bit of the x bits.

[4] The semiconductor memory device according to [3], wherein at least one value among the $2^x$ threshold voltages is shifted from the original value.

[5] The semiconductor memory device according to [4], wherein for the plural memory cells having the threshold voltage corresponding to the prepared data bit row, independent of the threshold voltage of the plural memory cells, the value of the voltage for turning on these plural memory cells is made to be smaller than the original value.

[6] The semiconductor memory device according to [5], wherein the value of i is held for at least one of the plural memories.

[7] The semiconductor memory device according to [6], wherein as far as the prescribed value is concerned, the (x−i) bits may have the value of either 0 or 1 or the same value as that of the bit that is 1 step lower in the sequence, or the values of the (x−i) bits may be any values independent from each other.

The configuration of the memory cell array 1 is disclosed in U.S. patent application Ser. No. 12/407,403, filed on Mar. 19, 2009 and entitled "three dimensional stacked nonvolatile semiconductor memory," in U.S. patent application Ser. No. 12/406,524 filed on Mar. 18, 2009 and entitled "three dimensional stacked nonvolatile semiconductor memory," in U.S. patent application Ser. No. 13/816,799, filed on Sep. 22, 2011 and entitled "nonvolatile semiconductor memory device," and in U.S. patent application Ser. No. 12/532,030, filed on Mar. 23, 2009 and entitled "semiconductor memory and method for manufacturing the same." The entire descriptions of these patent applications are incorporated by reference herein.

The following modes may be adopted for the embodiment.

[1] A semiconductor memory device configured for a write operation, including:

a memory cell array including a plurality of pages, each page including a plurality of memory cells, each memory cell being configured to store three or more bits of data; and a controller configured to execute the write operation on the pages such that x bits of data are written in a first memory cell included in a first page selected from the plurality of pages and y bits of data are written in a second memory cell included in a second page selected from the plurality of pages, where x is different from y.

Figure 17:
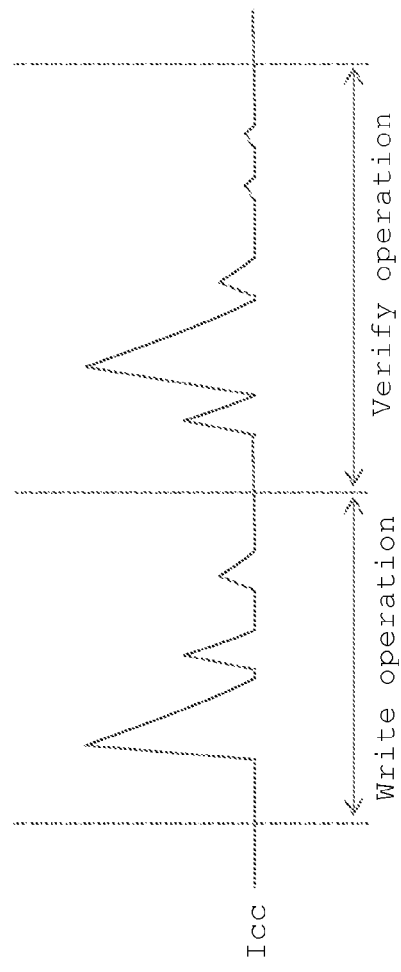
FIG. 17 is a diagram illustrating a consumption current in a semiconductor device according to an embodiment during the write operation and the verify operation.

In this above semiconductor device, the write operation and the verify operation are repeated in order to write x bits of data to the first memory cell or to write y bits of data to the second memory cell. FIG. 17 is a diagram illustrating Icc during the write operation and the verify operation, where Icc represents the consumption current of this semiconductor device.

Figure 18A:
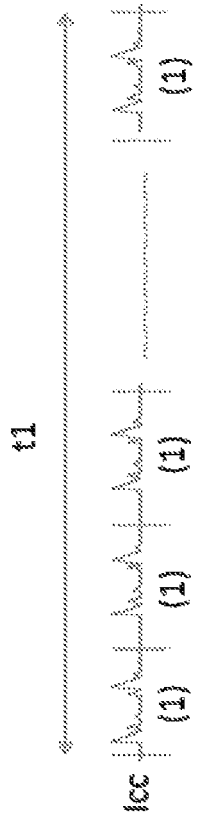
FIG. 18A and FIG. 18B are diagrams showing the amount of time taken to perform write and verify operations on first and second memory cells.
Figure 18B:
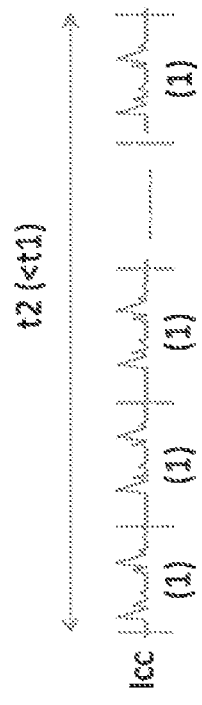

As described in FIG. 18A and FIG. 18B, it takes a first time t1 to write x bits of data to the first memory cell. It takes a second time t2 to write y bits of data to the second memory cell. The first time t1 is different from the second time t2. The first time t1 is larger than the second time t2 if x is larger than y because a repeat count of the write operation and the verify operation in writing x bits of data is larger than that of the write operation and the verify operation in writing y bits of data if x is larger than y.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array including a plurality of memory cells, each memory cell configured to store plural bits of data; and
   a controller configured to execute a write operation on the memory cells such that user data are written in at least one of the plural bits of data of said each memory cell and prescribed data are written in the remaining bits of the plural bits of data of said each memory cell,
   wherein the number of bits of user data stored in said each memory cell is less than the number of plural bits of data that said each memory cell is configured to store.

2. The semiconductor memory device of claim 1, wherein the controller is configured to execute the write operation on the memory cells such that the user data are written in two or more plural bits of data of said each memory cell.

3. The semiconductor memory device of claim 1, wherein the prescribed data are 1's.

4. The semiconductor memory device of claim 1, wherein the prescribed data are 0's.

5. The semiconductor memory device of claim 1, wherein the prescribed data have values that match a value of a highest order bit of the user data.

6. The semiconductor memory device of claim 1, wherein the plural bits of data are stored in said each memory cell as a distribution of threshold voltages.

7. The semiconductor memory device of claim 6, wherein the controller is configured to shift one or more of the threshold voltages.

8. The semiconductor memory device of claim 1, wherein the write operation is an en bloc write operation.

9. A semiconductor memory device configured for a write operation, comprising:
   a memory cell array including a plurality of pages, each page including a plurality of memory cells, each memory cell being configured to store three or more bits of data; and
   a controller configured to execute the write operation on the pages such that x bits of data are written in a first memory cell included in a first page selected from the plurality of pages and y bits of data are written in a second memory cell included in a second page selected from the plurality of pages, where x is different from y.

10. The semiconductor memory device of claim 9, wherein the bits of data are stored in the memory cells as a distribution of threshold voltages.

11. The semiconductor memory device of claim 10, wherein the controller is configured to shift one or more of the threshold voltages.

12. A method of controlling a semiconductor memory device comprising a memory cell array including a plurality of memory cells, each memory cell configured to store N bits of data (where N is an integer greater than 1), said method comprising:
   executing a write operation on the memory cells such that user data are written in i bits of data (where i is an integer less than N) and prescribed data are written in the remaining bits of the N bits of data; and
   storing a parameter i in a nonvolatile state.

13. The method of claim 12, further comprising:
   upon power-on, reading a parameter i; and
   executing a read operation on the memory cells to read i bits of data from each of the memory cells.

14. The method of claim 12, wherein the prescribed data are all 1's or all 0's.

15. The method of claim 12, wherein the prescribed data have values that match a value of a highest order bit of the user data.

16. The method of claim 12, further comprising:
    shifting one or more of threshold voltages that are set in the memory cells as a result of executing the write operation.

17. The method of claim 12, wherein the write operation is an en bloc write operation.

* * * * *